United States Patent [19]
Holt

[11] Patent Number: 5,450,766
[45] Date of Patent: Sep. 19, 1995

[54] TEST HEAD MANIPULATOR
[75] Inventor: Alyn R. Holt, Cherry Hill, N.J.
[73] Assignee: Intest Corporation, Cherry Hill, N.J.
[21] Appl. No.: 297,326
[22] Filed: Aug. 29, 1994

Related U.S. Application Data

[60] Continuation of Ser. No. 63,453, May 19, 1993, abandoned, which is a division of Ser. No. 734,192, Jul. 22, 1991, Pat. No. 5,241,870.

[51] Int. Cl.⁶ ............................................. G01D 21/00
[52] U.S. Cl. .................................................... 73/866.5
[58] Field of Search ............................ 73/866.5, 865.8; 324/158 F, 158 P; 248/371, 393, 395, 398, 177, 187, 214, 283, 284, 542, 904

[56] References Cited

U.S. PATENT DOCUMENTS

| | | | |
|---|---|---|---|
| 1,386,025 | 8/1921 | Pittman | 248/187 |
| 3,128,887 | 4/1964 | Guennec et al. | |
| 3,262,593 | 7/1966 | Hainer. | |
| 3,884,365 | 5/1975 | Thomson. | |
| 4,062,455 | 12/1977 | Hatau. | |
| 4,132,318 | 1/1979 | Wang et al. | |
| 4,273,506 | 6/1981 | Thomson et al. | |
| 4,289,441 | 9/1981 | Inaba et al. | |
| 4,299,529 | 11/1981 | Inaba et al. | |
| 4,345,847 | 8/1982 | Schiff et al. | |
| 4,370,091 | 1/1983 | Gagliardi. | |
| 4,527,942 | 7/1985 | Smith. | |
| 4,588,346 | 5/1986 | Smith. | |
| 4,705,447 | 11/1987 | Smith. | |
| 4,866,998 | 9/1989 | Stewart et al. | 73/866.5 |

FOREIGN PATENT DOCUMENTS

| | | | |
|---|---|---|---|
| 0012237 | 11/1979 | European Pat. Off. | |
| 0165272 | 7/1991 | Japan | 324/158 P |
| 2074337A | 4/1980 | United Kingdom. | |

OTHER PUBLICATIONS

Ohr, Stephen, Data Converters for Robotics Application, Electronic Products, pp. 69-75, Sep. 7, 1982.
IBM 7565 Manufacturing System Product Literature.
Reid Ashman Manufacturing Inc. Universal Manipulator Product Literature.

*Primary Examiner*—Robert Raevis
*Attorney, Agent, or Firm*—Ratner & Prestia

[57] ABSTRACT

A system is disclosed for positioning an electronic test head with respect to an electronic device handler. The positioner assembly includes separate locks which allow the test head to move vertically while preventing rotation of the test head about the main shaft. Thus, the test head can be aligned with the device handler, moved vertically away from the device handler while adjustments are made, and easily realigned with the device handler after adjustments have been completed. Alternatively, the separate locks allow the test head to rotate about the main shaft while preventing movement along the main shaft. Thus, the test head can be aligned with the device handler, rotated about the main shaft and away from the device handler while adjustments are made, and easily realigned with the device handler after adjustments have been completed. An index pin allows the test head to be rotated from an initial position to a temporary position and then rotated from the temporary position back to the initial position without requiring realignment of the test head relative to the device handler. The system includes a projected cradle assembly which allows the heavy test head to be projected above or below a physically large handler while still pivoting the load of the test head with its cable assembly at its center of gravity.

15 Claims, 13 Drawing Sheets

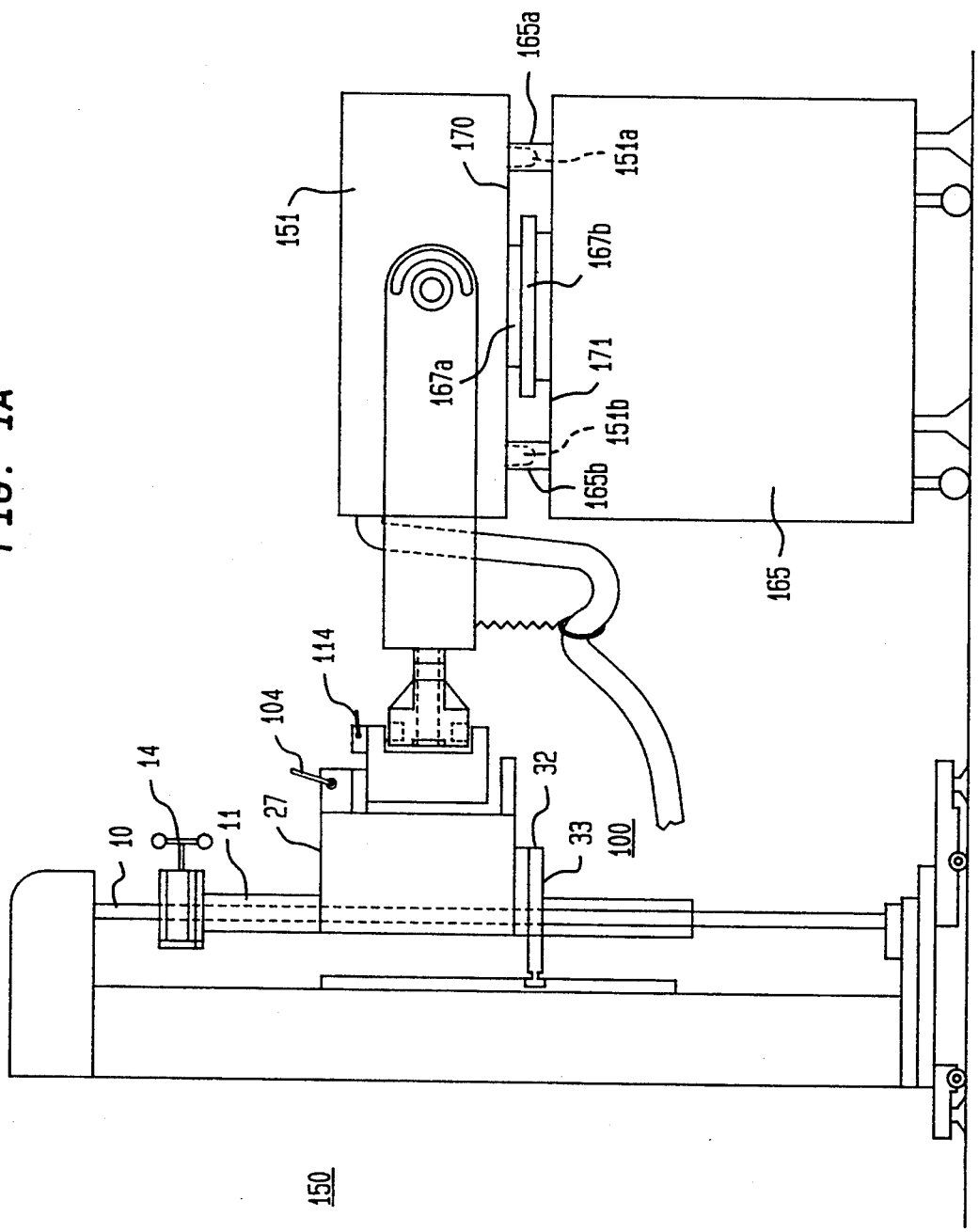

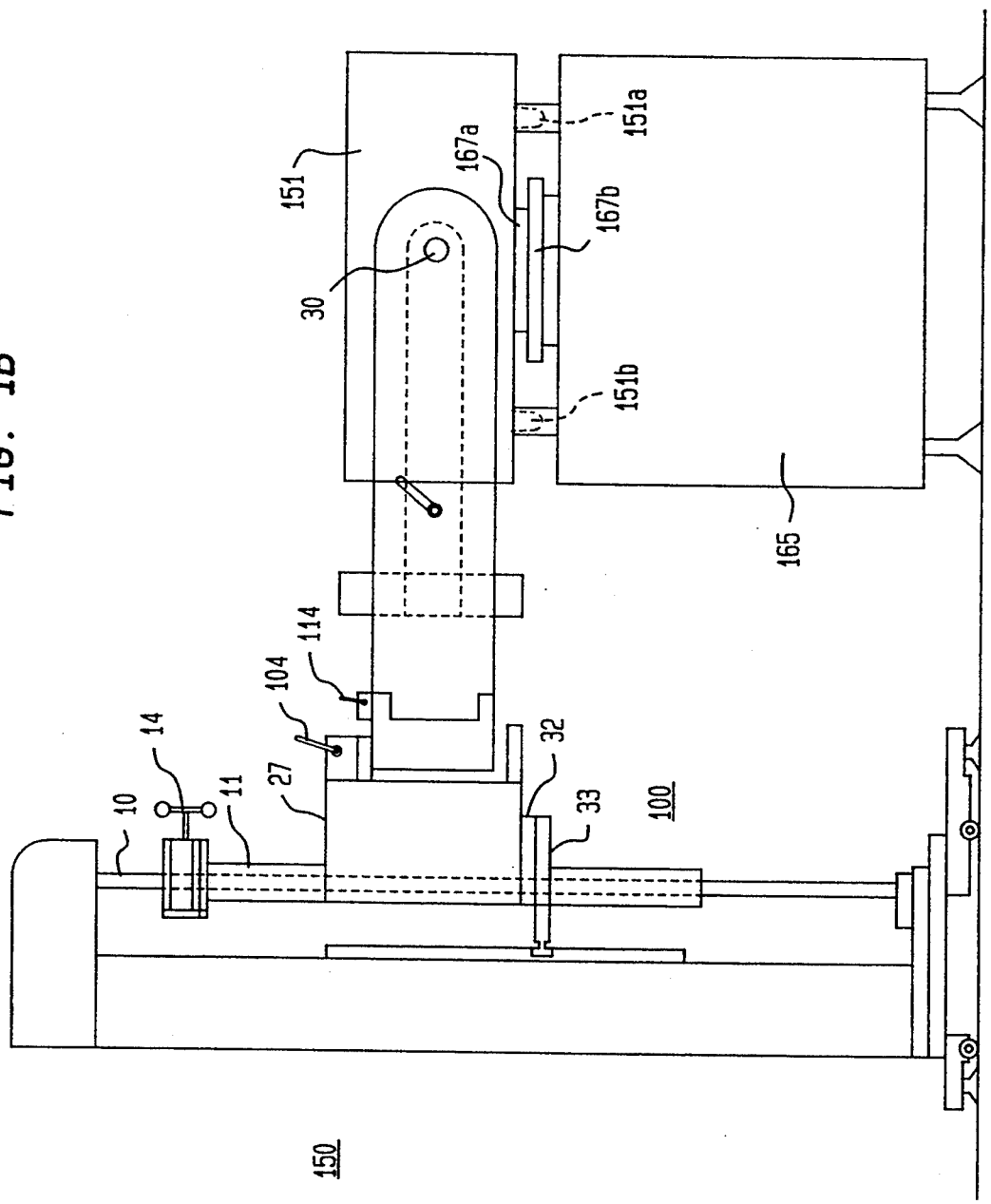

TEST HEAD MANIPULATOR

This application is a continuation of application Ser. No. 08/063,453 filed May 18, 1993, now abandoned.

A. FIELD OF THE INVENTION

This invention relates to the field of art of electronic test head positioners.

B. BACKGROUND ART

In the automatic testing of integrated circuits (IC) and other electronic devices, special device handlers have been used which brings the device to the proper temperature and places the device to be tested in position. The electronic testing itself is provided by a large and expensive automatic testing system which includes a test head which has been required to connect to and dock with the device handler. In such testing systems, the test head has been usually very heavy—on the order of 40 to 300 kilograms. The reason for this heaviness is that the test head uses precision high frequency control and data signals so that the electronic circuits must be located as close as possible to the device under test. Accordingly, the test head has been densely packaged with electronic circuits in order to achieve the accurate high speed testing of the sophisticated devices.

Test head positioner systems may be used to position the test head with respect to the device handler. When the test head is accurately in position with respect to the device handler, the test head and the device handler are said to be aligned. When the test head and device handler are aligned, the fragile test head and device handler electrical connectors can be brought together (i.e. docked), enabling the transfer of test signals between the test head and the device handler. Prior to docking, the fragile test head and device handler electrical connectors must be precisely aligned to avoid damaging the fragile electrical connectors.

Test head positioners are designed in several configurations, each configuration being desirable for a particular purpose. In a tumble mode positioner, the test head pivots (or tumbles) about two oppositely disposed pivot points within a cradle. This enable the user to tumble the test head in the cradle from a position where the device handler interface board is up (for interface to horizontal plane handlers from the bottom), through 180 degrees, to a position where the device handler interface board is down (for interface to horizontal plane handlers from the top). In a cable pivot mode positioner, the test head pivots on the axis of the test head cables. Compared to the tumble mode positioner, a cable pivot mode positioner allows the use of reduced cable lengths.

An example of a tumble mode positioner is disclosed in a previous patent by Smith (U.S. Pat. No. 4,705,447), herein incorporated by reference. This patent discloses a positioner assembly which enables a test head to be moved for docking and undocking with respect to three vertical axes. In an alternative embodiment, the test head may be moved for docking and undocking with respect to two vertical axes and one horizontal axis. Thus, in either embodiment, the test head may be manipulated with six degrees of freedom with respect to the center of the plane defined by the test head electrical interface.

Problems have been incurred in easily moving the heavy test head accurately into position with respect to the device handler mechanism. A common lock may prohibit both vertical motion and rotational motion of the test head about a main shaft. To move the test head vertically, the common lock is loosened, thus permitting rotational movement of the test head. Similarly, to rotate the test head, the common lock is loosened, thus allowing the test head to move vertically. However, when a test head is temporarily moved away from the device handler (i.e. undocked) so that adjustments or repairs can be made, both the vertical and the rotational position of the test head may need readjustment to ensure that the test head is aligned with the device handler. The large variety of orientations which the test head may assume may overwhelm an unskilled operator, thus making realignment difficult.

Additional problems have been incurred in realigning the test head and the device handler after the test head has been moved away for repairs or adjustments. Some prior art manipulators include an additional point of rotation (i.e. an additional link) between the main shaft and the test head. By creating an additional link, the test head can be rotated about the axis defined by the link, thus maintaining the relative orientations of the remaining parts of the positioner. However, by adding additional links, the distance between the main shaft and the test head is increased, thus increasing the torque which is imposed by the test head on the main shaft bearings. Thus, the main shaft bearings, main shaft and main arm must become larger and more expensive to provide eased movement and reduced friction between manipulator parts under a greater load.

Examples of cable pivot mode positioner are disclosed in a previous patent by Holt (U.S. Pat. No. 4,893,074), herein incorporated by reference. FIG. 1 and FIG. 2 of this patent shows a first type of cable pivot mode positioner which is referred to as an opposite end cable pivot (OECP) style cradle assembly. As shown in FIG. 1 and FIG. 2, the test head is held at its center of gravity by the positioner. The cable and positioner are attached to the test head on opposite ends of the test head. Because the centerline of the device under test is desirably physically close to the centerline of the electrical outputs of the test head (located near the physical center of the test head) the OECP style cradle assembly may be inappropriate for use with large device handlers. This is because the OECP style cradle assembly cannot access, from underneath, horizontal plane handlers which are built like two pedestal office desks; the positioner stands where one pedestal of such a desk would be located. If the test head were to be projected away from the positioner assembly's support column so that the centerline of the device under test was physically close to the physical center of the test head, pivoting would not occur at the center of gravity of the horizontal wrist shaft, resulting in an unbalanced system.

FIG. 3 of the '074 patent shows a second type of cable pivot mode positioner which is referred to as a cable pivot with center of gravity offset (CPCG) style cradle. The CPCG style cradle allows somewhat more projection of the test head than the OECP style cradle. However, as with the OECP style cradle, the CPCG style cradle is unable to sufficiently project the test head without imposing overwhelming torque on the positioner assembly.

Thus, to solve the interface problem, it is desirable to project the electrical output of the test head a large distance under or over the physically large handlers or probers so that the positioner itself can stand clear of the handlers or probers to which the test head is interfaced. It is also important to continue to enable the test head to pivot with six degrees of motion freedom about the center of gravity of the test head and cable assembly.

For purposes of considering patentability, a brief patentability search was conducted. The patents identified to be of possible interest in the search were:

| Patent No. | Inventor |
| --- | --- |
| 3,262,593 | William Hainer |
| 4,345,847 | Schiff et al. |
| 4,229,136 | Hugo Panissidi |
| 4,132,318 | Wang et al. |
| 3,128,887 | Guennec et al. |

SUMMARY OF THE INVENTION

A system for positioning an electronic test head with respect to an electronic device handler. The system includes a support column with a main shaft. A tube moves along the main shaft. The tube may be locked in place to prevent its movement along the main shaft. An upper arm assembly pivots about the tube. A shoulder index plate supports the upper arm assembly as the upper arm assembly pivots about the tube. A lock screw, when actuated, locks the upper arm assembly to the shoulder index plate, thus preventing the upper arm assembly from pivoting relative to the shoulder index plate.

The system includes a projected cradle assembly which allows the heavy test head to be projected above or below a physically large handler while still pivoting the load of the test head with its cable assembly at its center of gravity. This provides the system with the freedom of six degrees of motion so that the heavy test head can easily interface to a physically large handler or prober in the horizontal plane.

BRIEF DESCRIPTION OF THE DRAWINGS

FIGS. 1A is a diagrammatic view of the system of FIGS. 2 to 5 showing the docking of a test head with the electrical interface of a handler;

FIG. 1B is a diagrammatic view of the system of FIGS. 7-8 showing the docking of a test head in a projected cradle with the electrical interface of a handler;

OVERVIEW

The present invention is a positioner system 150 for positioning an electronic test head 151 with respect to an electronic device handler 165. The positioner system allows the electronic test head 151 to be moved away from the electronic device handler 165 (for adjustments or repairs) while partially maintaining alignment between the electronic test head 151 and the electronic device handler 165. By maintaining partial alignment, redocking of the electronic test head 151 with the electronic device handler 165 is simplified.

Figure 2:
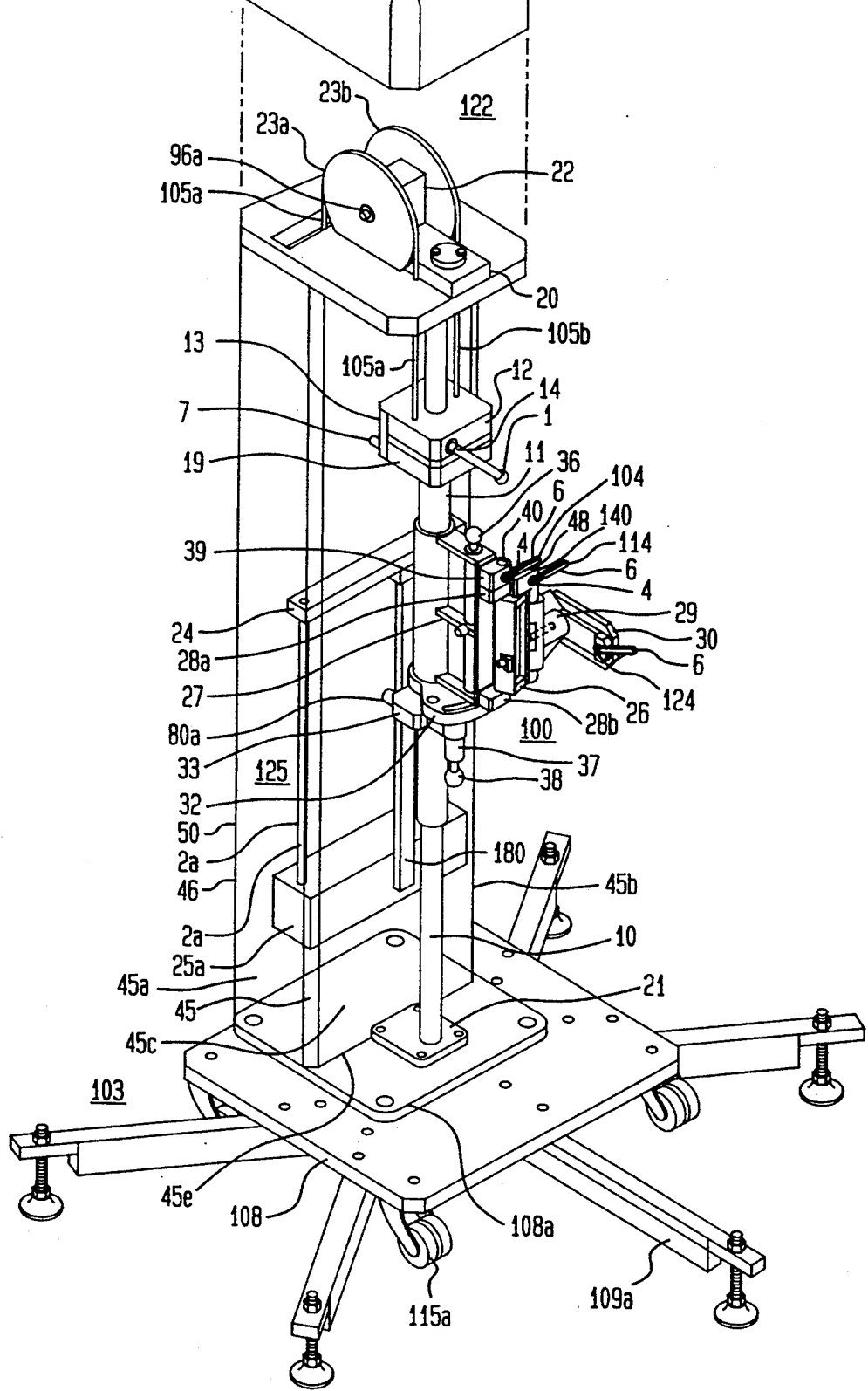
FIG. 2 is a perspective view of a test head positioner system in accordance with the present invention.

An exemplary embodiment of the positioner system is shown in FIGS. 1A and 2. The positioner system 150 includes a shaft 10 defining a first vertical axis.

A positioner assembly 100 moves the test head 151 along the first vertical axis. This is accomplished by movement of main arm tube 11 along shaft 10. Main arm tube 11 can be prevented from moving along shaft 10 by tightening vertical lock screw assembly 14.

The test head 151 may be moved about the first vertical axis by rotating upper arm unit 27. Upper arm unit 27 is carried by shoulder lock plate 32 which in turn is carried by index lock plate 33. Index lock plate 33 is secured to tube 11. Thus, index lock plate 33, shoulder lock plate 32 and upper arm unit 27 move with tube 11 along the first vertical axis. Upper arm unit 27 may pivot about the first vertical axis while shoulder lock plate 32 is maintained stationary. Movement of upper arm unit 27 relative to shoulder lock plate 32 about the first vertical axis can be prevented by actuating vernier lock screw 36. Upper arm unit 27 and shoulder lock plate 32 may pivot together about the first vertical axis. Movement of shoulder lock plate 32 about the first vertical axis is prevented by engaging lock pin 38 in one of several openings in shoulder lock plate 32.

The test head 151 may be moved about the second vertical axis. The second vertical axis is defined by shaft 40. Forearm 26 moves about the second vertical axis by pivoting about shaft 40. Movement of forearm 26 about the second vertical axis can be prevented by actuating lock screw assembly 104.

The test head 151 may be moved about the third vertical axis. The third vertical axis is defined by shaft 140. Wrist housing 29 moves about the third vertical axis by pivoting about shaft 140. Movement of wrist housing 29 about the third vertical axis can be prevented by actuating lock screw assembly 114.

The test head 151 may be moved about a horizontal axis. This is accomplished by pivoting horizontal wrist shaft 30 relative to wrist housing 29. Movement of horizontal wrist shaft 30 about the horizontal axis can be prevented by lock screw assembly 124.

The various locks within positioner assembly 100 (e.g. 104, 114) are always left unlocked when the test head 151 is docked with the device handler. This allows the positioner assembly 100 to float and absorb any motion or vibration from the handler. If the positioner were locked, then the electrical interface between test head 151 and device handler 165 would absorb the motion or vibration. This may damage the electrical interface. Conversely, the positioner locks are tightened when the test head is undocked. If the positioner locks were not tightened, the test head may move (float), causing possible damage to the equipment and injury to the operator.

The test head 151 may be undocked and redocked with the device handler with minimal realignment. When the test head is docked with a device handler in the horizontal plane, the test head can be undocked by moving positioner assembly 100 away from the docked position along main shaft 10. After moving positioner assembly 100, lock screw assembly 14 can be actuated to ensure that the test head does not move in its undocked state. Thus, damage to the test head and injury to the operator is prevented. The test head can then be pivoted about the first vertical axis to facilitate access to the device handler. This is accomplished by pulling lock pin 38 downward. Lock pin 38 normally engages one of several holes in shoulder lock plate 32. By pulling lock pin 38 downward, shoulder lock plate 32 (and thus upper arm assembly 27) can pivot about the first vertical axis. Thus, although the test head is moved away from the device handler, partial alignment of the test head relative to the device handler is maintained provided all other lock screws (36, 104, 114, 124, etc.) are actuated before the test head 151 is undocked. To redock the test head with the device handler, shoulder lock plate 32 (and thus upper arm assembly 27) is pivoted back to its original position so that lock pin 38 again engages the hole in shoulder lock plate 32 which lock pin 38 originally engaged. The positioner assembly 100 is then moved down shaft 10 to the docked position.

When the test head is docked with a device handler in the vertical plane, the test head can be undocked by actuating lock screw assembly 14 and pivoting the test head about the three vertical axes. By pivoting about the three vertical axes with lock screw assembly 14 actuated, the test head can be manually pushed away from the device handler without changing the positioner assembly's vertical position. Thus, when realigning the test head with the device handler, it is unnecessary to adjust the vertical position of the positioner assembly. After adjustments have been made to the device handler, the positioner assembly can be redocked with the device handler.

DETAILED DESCRIPTION OF THE PREFERRED EMBODIMENT

Referring now to FIG. 1A, there is shown a test head positioner system 150 in accordance with the invention. As shown, positioner system 150 carries a test head 151 for a test system for docking with electrical contactor 167b of an integrated circuit handler 165. It will be understood that other electronic devices may be handled by the device handler, such as transistors, chips or dies, etc. In operation, positioner assembly 100 is moved manually in a substantially weightless condition to manipulate the heavy test head 151 accurately and precisely and dock it to handler 165. Docking is accomplished through the use of a docking assembly 170, attached to test head 151 and a docking gusset assembly 171, attached to the device handler 165. In docking, location pins 151a, 151b projecting from docking assembly 170 are inserted into corresponding openings 165a, 165b in docking gusset assembly 171 and electrical interface board 167a enters and mates with mating electrical contactor 167b which electrically connects the test head to the device to be tested. Electrical interface board 167a and electrical contactor 167b are collectively referred to as the electrical interface. As will later be described in detail, the position of test head 151 may be accurately manipulated in a substantially weightless condition to another position with six degrees of freedom to dock docking assembly 170 with other docking gusset assemblies in any position. For example, probers or handlers may be anywhere from a horizontal plane to a vertical plane. Furthermore, it is possible to undock the test head 151 from the electrical contactor 167b and to redock the test head 151 with electrical contactor 167b with a minimal amount of manipulation of the test head positioner assembly 100.

The details of positioner system 150 are shown in FIG. 2 in which there is provided a C-shaped beam forming a vertical housing or support column 45. Column 45 has opposing walls 45a, b, front wall 45c, top plate 45d (not shown) and bottom plate 45e. Column 45 is supported at its bottom by a base assembly 103 having a base plate 108 and outwardly extending legs 109a through 109e which are bolted to the bottom of plate 108, for example. Wheel assemblies 115a through d are also bolted to the bottom of plate 108. Column 45 is secured to plate 108 by bolts 108a, for example. The rear of column 45 is enclosed by a U-shaped cover 46 (not shown) which engages a plurality of pins located on bottom plate 45e. Cover 46 is held in place by a frictional hold relative to walls 45a,b.

Test head 151, FIG. 1A, is supported and manipulated in its docking by positioner assembly 100 which is adapted to move vertically on a main shaft 10. Assembly 100 comprises main arm tube 11, index lock plate 33, shoulder lock plate 32, upper arm assembly 27, forearm assembly 26, wrist housing assembly 29, and shaft assembly 30. Main shaft 10 is secured in place on the front section of column 45 by opposing pillow blocks 20, 21.

Positioner assembly 100 is adapted to ride vertically on main shaft 10 by a counter weight assembly 125 which moves vertically in either direction within the rear section of column 45. Assembly 125 includes weight rod mount 24 with vertically extending weight rod 2a and vertically extending weight rod 2b (not shown) secured thereto and weight 25a coupled to the weight rods. Additional weights (not shown) are added to exactly counterbalance the weight of assembly 100, together with the test head, so that the test head and assembly 100 are substantially weightless.

Mount 24 securely receives flexible cables 105a,b respectively. Cables 105a,b are received through an opening in top plate 45e and are received within grooves of pulleys 23a,b respectively of pulley assembly 122. Assembly 122 includes pulley mount 22 which is secured to top plate 45e. Pulley mount 22 includes an opening through which shoulder screw 96a and shoulder screw 96b (not shown) are placed. Shoulder screws 96a and 96b permit the rotation of pulleys 23a,b. Pulley assembly 122 is enclosed within hood 47.

Positioner assembly 100 includes main arm tube 11 which is disposed about main shaft 10. Main arm tube 11 moves vertically in either direction along main shaft 10. The upper end of main arm tube 11 is secured to lift block 19 which in turn is connected to lock collar 12. Lock collar 12 is also located about main shaft 10. By tightening lock screw assembly 14, the vertical position of main arm tube 11 relative to main shaft 10 remains fixed. In an exemplary embodiment of the present invention, lock collar 12 may be implemented in accordance with that disclosed in U.S. Pat. No. 4,715,574, incorporated herein by reference. Lift block 19 securely receives flexible cables 105a, b, respectively, through a plurality of openings in lock collar 12. In this manner, positioner assembly 100 is coupled to counter-weight assembly 125.

Figure 3:
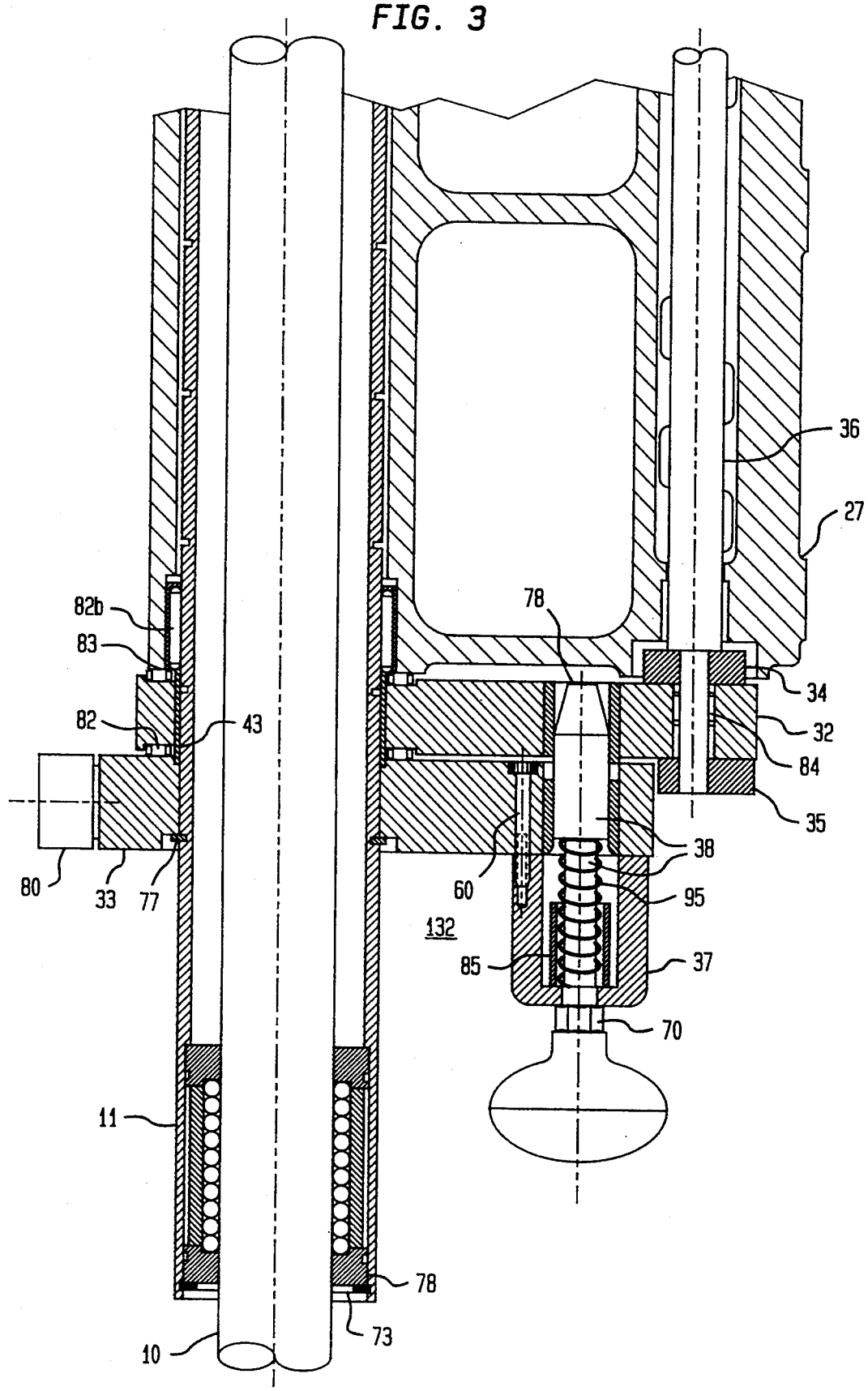
FIG. 3 is a perspective cutaway view of a portion of FIG. 1.

Referring now to FIG. 3, there is shown the details of a portion of positioner assembly 100. Retainer ring 77 is a circular member which is secured about main arm tube 11. Retainer ring 77 carries index lock plate 33 which slidably engages and supports shoulder lock plate 32. Alternately, retainer ring 77 may be deleted and index lock plate 33 attached directly to main arm tube 11 by welding, for example. Index lock plate 33 and shoulder lock plate 32 each include an opening through which main arm tube 11 is placed. Upper arm assembly 27 includes a cylindrical member which pivots about tube 11. Shoulder lock plate 32 supports upper arm assembly 27 as upper arm assembly 27 pivots about the tube 11.

Retainer ring 77 is secured to main arm tube 11 by engaging main arm tube 11 in one of a plurality of incrementally spaced grooves located on main arm tube 11. Thus, by inserting retainer ring 77 in a different groove within the main arm tube 11, the height of the positioner assembly 100 relative to main arm tube 11 can be adjusted.

Sleeve bearing 43 is inserted inside shoulder lock plate 32 and around main arm tube 11, thus facilitating rotation of shoulder lock plate 32 about main arm tube 11. Thrust bearing 82 is located between shoulder lock plate 32 and index lock plate 33. Thrust bearing 82b is located between upper arm assembly 27 and main arm tube 11. Needle bearing 83 is located between upper arm assembly 27 and lock shoulder plate 32. Additional bearings are located between moving parts at appropriate places within system 150. Cam follower 80a and cam follower 80b (not shown) are fastened to index lock plate 33 and ride on either side of vertical guide bar 180. Vertical guide bar 180 is attached to column 45, thus preventing the rotation of index lock plate 33 about main arm tube 11.

Index lock pin assembly 132 enables shoulder lock plate 32 to be locked into one of a plurality of positions about main arm tube 11. Index lock pin assembly 132 includes index lock pin housing 37 which is secured to the underside of index lock plate 33 by fastener 60. Index lock pin assembly 132 also includes index lock pin 38. Index lock pin 38 includes a first portion, with tapered end, which fully occupies an opening in index plate 33, a second portion, with diameter smaller than the first portion, surrounded by a spring, and a third portion which engages football knob 90, exterior to index lock pin housing 37. Lock pin 38 is urged towards the opening in shoulder lock plate 33 by spring 95. In an exemplary embodiment, index lock pin 38 may be actuated by using pneumatics or electromagnets, allowing index lock pin 38 to be moved upward and/or downward from a remote location. Other locks (14, 36, 104, 114, 124, etc.) may also be so remotely controlled.

A plurality of openings are located in shoulder lock plate 32. These openings are incrementally spaced and can each be lined up with lock pin 38. Lock pin 38 can be urged into any of the openings in shoulder lock plate 32 depending on the orientation of shoulder lock plate 32 about main arm tube 11. In this manner, the orientation of shoulder lock plate 32 about main arm tube 11 may be maintained by preventing the pivoting of shoulder lock plate 32 relative to index lock plate 33.

Figure 4:
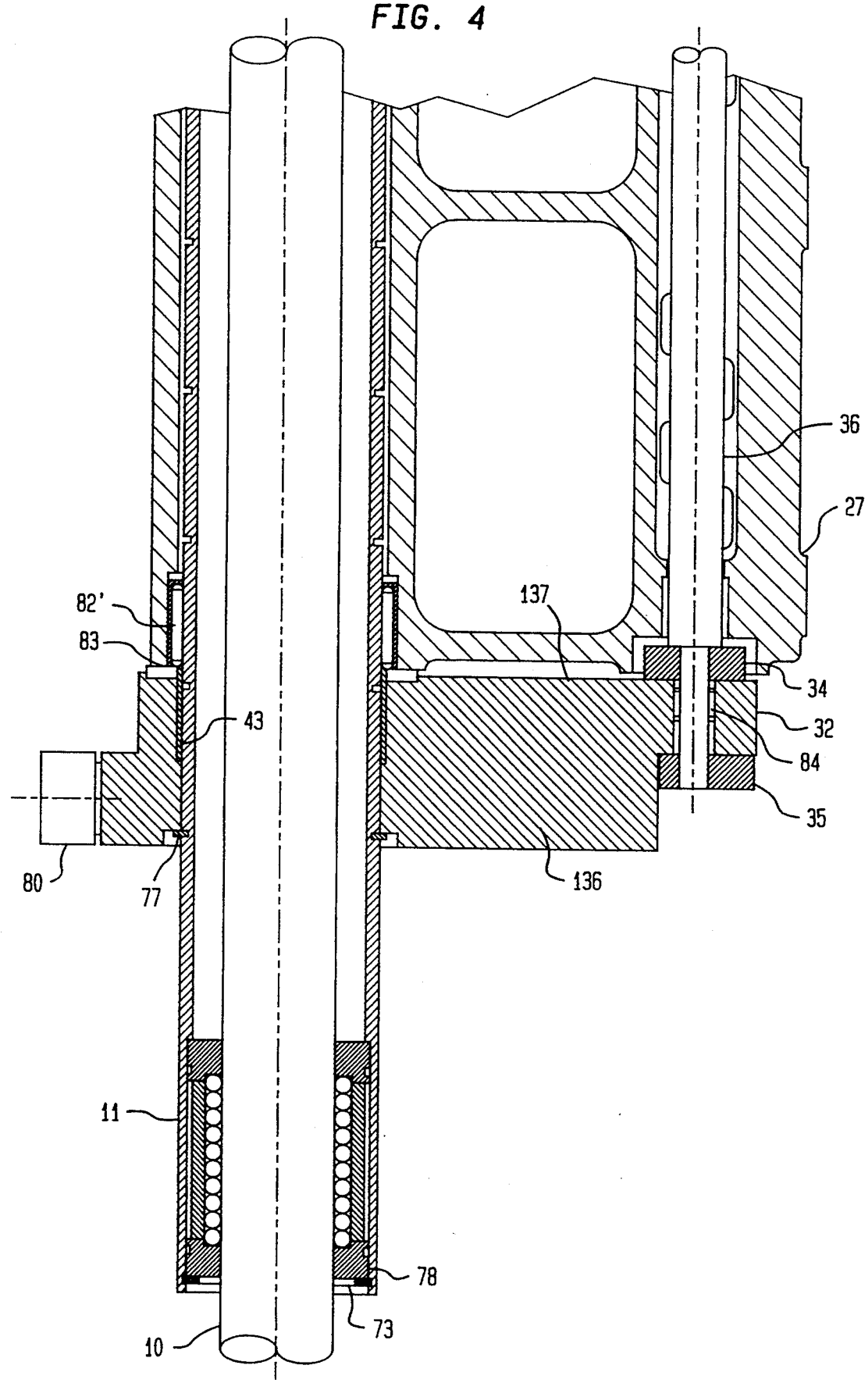
FIG. 4 is a perspective cutaway view of an alternate embodiment of the present invention.

Upper arm assembly 27 includes an opening through which vernier lock screw 36 is inserted. Vernier lock screw 36 is a stepped shank with threaded end. Football knob 36a (shown in FIG. 4) is secured to non-threaded end of lock screw 36 and is used for rotating vernier lock screw 36. The threaded end of vernier lock screw 36 is inserted through a continuous opening which is located along part of the perimeter of shoulder lock plate 32. Lock pad 34 is located between upper arm 27 and lock shoulder plate 32. The shoulder of vernier lock screw 36 bears against the upper surface of lock pad 34. Lock pad 35 is located below lock shoulder pad 32. The opening in shoulder pad 35 is threaded to accommodate vernier lock screw 36. By rotating vernier lock screw 36, lock pad 35 is drawn upwards by the threaded portion of vernier lock screw 36 and lock pad 34 is pushed downwards by the shoulder of vernier lock screw 36. Thus, the rotation of upper arm assembly 27 relative to lock shoulder plate 32 is prevented by tightening vernier lock screw 36.

In an exemplary embodiment of the present invention, shoulder lock plate 32 and index lock plate 33 are replaced with a single support member 136. This is shown with reference to FIG. 4. Support member 136 is secured to main arm tube 11. Upper arm assembly 27 slides over the upper surface of support member 136 as support member 136 remains stationary and supports upper arm assembly 27 and upper arm assembly 27 pivots about tube 11. Vernier lock screw 36 allows or prevents rotation of upper arm assembly 27 relative to lock plate 136 by releasably locking the upper arm assembly 27 to support member. This is described above with reference to FIG. 3.

Figure 5:
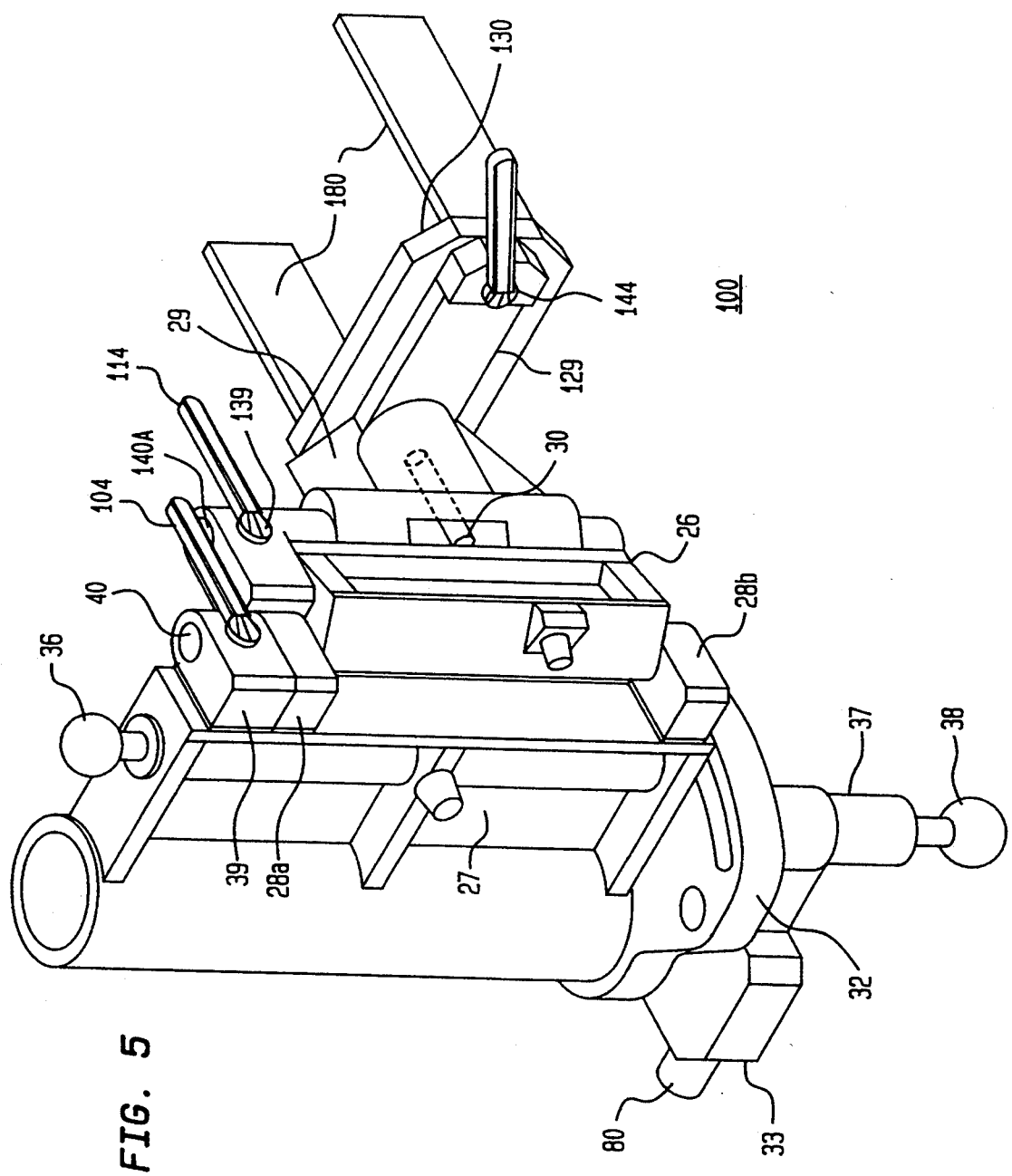
FIG. 5 is a perspective view of the detailed structure of the positioner assembly.

Referring now to FIG. 5, there is shown the details of a further portion of positioner assembly 100.

Secured to the front of upper arm assembly 27 are a pair of mount blocks 28a, 28b and lock collar 39 positioned above mount block 28a.

Forearm 26 rotates with respect to upper arm assembly 27 by way of vertical shafts 40a and b (not shown) which extends through a vertical opening in lock collar 39 through mount block 28a, into forearm 26 and then from the bottom of forearm 26 into an opening in mount block 28b. Vertical shafts 40a and b are rigidly secured within forearm 26. Forearm 26 may be temporarily prevented from rotation by means of lock screw assembly 104 which is formed within lock collar 39.

Forearm 26 has a front "C" shaped section which rotatively receives wrist housing 29. Lock collar 139 is slidably secured to the upper surface of forearm 26. Wrist housing 29 rotates with respect to forearm 26 by way of vertical shafts 140a and b (not shown). Vertical shaft 140a extends through a vertical opening in lock collar 139, through a vertical opening in forearm 26 and into wrist housing 29. Vertical shaft 140b extends through the bottom of wrist housing 29 into a lower opening in forearm 26. Shafts 140a and b are rigidly secured within wrist housing 29. Wrist housing 29 may be temporarily prevented from rotation by means of lock screw assembly 114 which is formed within lock collar 139.

Wrist housing 29 includes a member 129 which projects from an end of wrist housing 29 at a substantially right angle. Horizontal wrist shaft 30 is coupled to horizontal member 130. Horizontal member 130 is rotatable with respect to member 129 by means of horizontal wrist shaft 30 which extends through housing 29. In other words, horizontal member 130 is capable of rotating about an axis defined by horizontal wrist shaft 30. Horizontal member 130 slidably engages member 129 to form a disc style lock mechanism. Horizontal member 130 may be temporarily prevented from rotation by tightening lock screw assembly 144, thus applying pressure between horizontal member 130 and member 129.

Cradle assembly 180 is attached to shaft 30 via horizontal member 130. The test head is attached to the cradle assembly 180 as shown in U.S. Pat. No. 4,705,447 herein incorporated by reference. In this manner, test head 151 may pivot about a plurality of pivot points within cradle assembly 180. When the test head pivots in this manner, the test head is said to undergo test head tumble action. Furthermore, when the test head pivots in this manner, the test head is said to be in tumble mode. The test head docks and undocks with the device handler using the docking apparatus, as described in U.S. Pat. No. 4,705,447.

Figure 6:
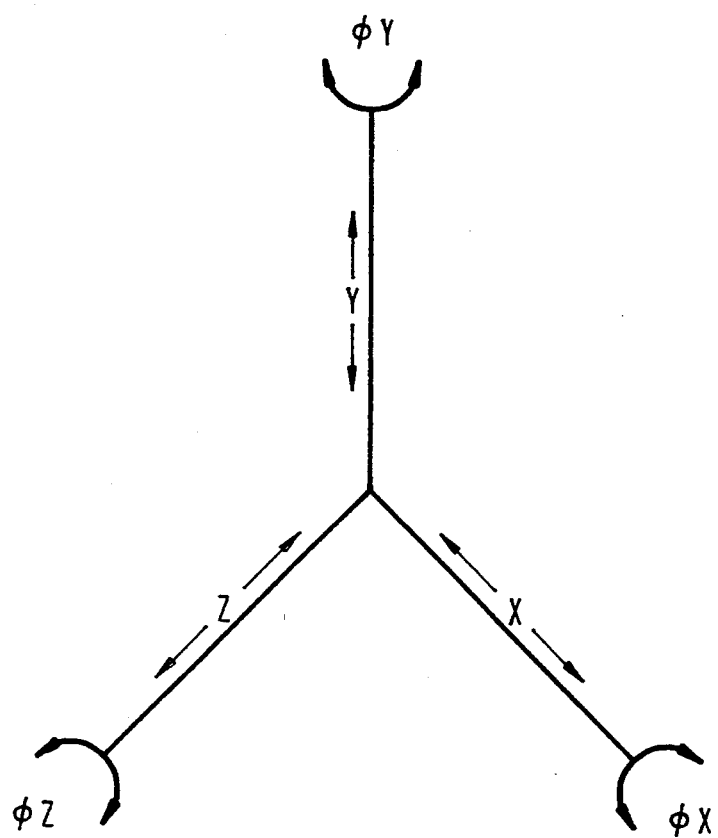
FIG. 6 diagrammatically shows the six degrees of freedom of the system of FIGS. 1 through 4.

It will now be understood that positioner assembly 100 simultaneously positions in 6 degrees of freedom, X, Y, Z, $\Theta x$, $\Theta y$, $\Theta z$. As shown in FIG. 6, it is important for proper docking that test head 151 have 6 degrees of freedom so that electrical contactor 167b can accurately and effortless be positioned with respect to electrical interface board 167a, for example.

If the Y direction were considered to be the vertical or up/down direction, then the movement of assembly 100 vertically with respect to shaft 10 provides the Y direction of freedom.

$\Theta Y$ freedom, which is the rotation about the Y axis is then provided by rotation of upper arm 27 about tube 11, forearm 26 about shaft 40 and wrist housing 29 about shaft 140. In addition, a true translated $\Theta Y$ rotation with respect to the center of the connectors is provided by the rotation of upper arm 27 about tube 11, forearm 26 about shaft 40 and wrist housing 29 about shaft 140.

If the X direction were considered to be the left to right direction, then that freedom is provided by pivoting about main arm tube 11, shaft 40 and shaft 140 in the same manner as $\Theta Y$.

$\Theta X$ movement, which is the rotation about the X axis, is provided by pivoting the test head about the pivot points within cradle assembly 180.

With respect to Z movement which may be considered to be the in and out movement, such freedom is provided by pivoting about main arm tube 11, shaft 40 and shaft 140 in the same way as $\Theta Y$ and X.

$\Theta Z$ movement, which is the rotation about the Z axis, is provided by pivoting shaft 30 relative to wrist housing 29.

Test head positioner system 150 is able to move test head 151 with 6 degrees of freedom between a docked and an undocked position. Thus, positioner assembly 100 can move vertically along shaft 10, and pivotal movement is allowed about main arm tube 11, shaft 40, shaft 140 and horizontal wrist shaft 30.

When test head 151 is docked with device handler 165, all of the locks in test head positioner system 150 (e.g. lock screw assemblies 104, 114, 144) may be left unlocked. This allows test head positioner system 150 to absorb vibration which is transmitted from device handler 165 to test head 151. By contrast, when test head 151 is docked with device handler 165, if all the locks in test head positioner system 150 were locked, electrical interface components 167a,b would absorb transmitted vibrations. This may damage the electrical interface.

When test head 151 is not docked with device handler 165, all of the locks in test head positioner system 150 may be actuated. This maintains the position of test head 151. By contrast, when test head 151 is not docked with device handler 165, if the locks in test head positioner system 150 are unlocked, the heavy test can easily move. This increases the risk of operator injury and equipment damage.

After the test head 151 has been docked with the device handler 165, it may be necessary to undock the test head 151, make adjustments to the test head 151 or the device handler 165, and then to redock the test head 151 with the device handler 165. The present invention allows this procedure to be accomplished with minimal adjustments to the positioner assembly.

If the test head 151 has been docked with the device handler 165 in the horizontal plane (i.e., the front surface of the test head 151 is parallel with the floor), then, the test head 151 is undocked from the device handler 165 by actuating lock screw assemblies 104, 114, 144, 36 as well as tumble action locks (e.g. all locks except lock 14) and moving the test head 151 away from the device handler 165 in a vertical direction. Lock screw assembly 14 is then actuated to maintain positioner assembly 100 in a desired vertical position while test head 151 is undocked. The test head 151 can then be pivoted about the first vertical axis to facilitate access to the device handler 165. This is accomplished by pulling lock pin 38 downward. As previously stated, lock pin 38 normally engages one of several holes in shoulder lock plate 32. By pulling lock pin 38 downward, shoulder lock plate 32 (and thus upper arm assembly 27) can pivot about the first vertical axis, until lock pin 38 is urged into a different hole. Thus, the test head 151 can be pivoted about the first vertical axis without loosening lock screw assembly 14. When any repairs or adjustments have been completed to the test head or the device handler, redocking of the test head relative to the device handler can be accomplished by pulling lock pin 38 downward, thus allowing shoulder lock plate 32 (and thus upper arm assembly 27) to pivot back to its original position so that lock pin 38 again engages the hole in shoulder lock plate 32 which lock pin 38 originally engaged. Lock screw assembly 14 is then loosened and the positioner assembly 100 is moved to the docked position.

When the test head is docked with a device handler in the vertical plane, the test head can be undocked by actuating lock screw assembly 14 and pivoting the test head about the three vertical axes. By pivoting about the three vertical axes with lock screw assembly 14 actuated, the test head can be manually pushed away from the device handler without changing the positioner assembly's vertical position. Thus, when realigning the test head with the device handler, it is unnecessary to adjust the vertical position of the positioner assembly. After adjustments have been made to the device handler, the positioner assembly can be redocked with the device handler.

Figure 7:
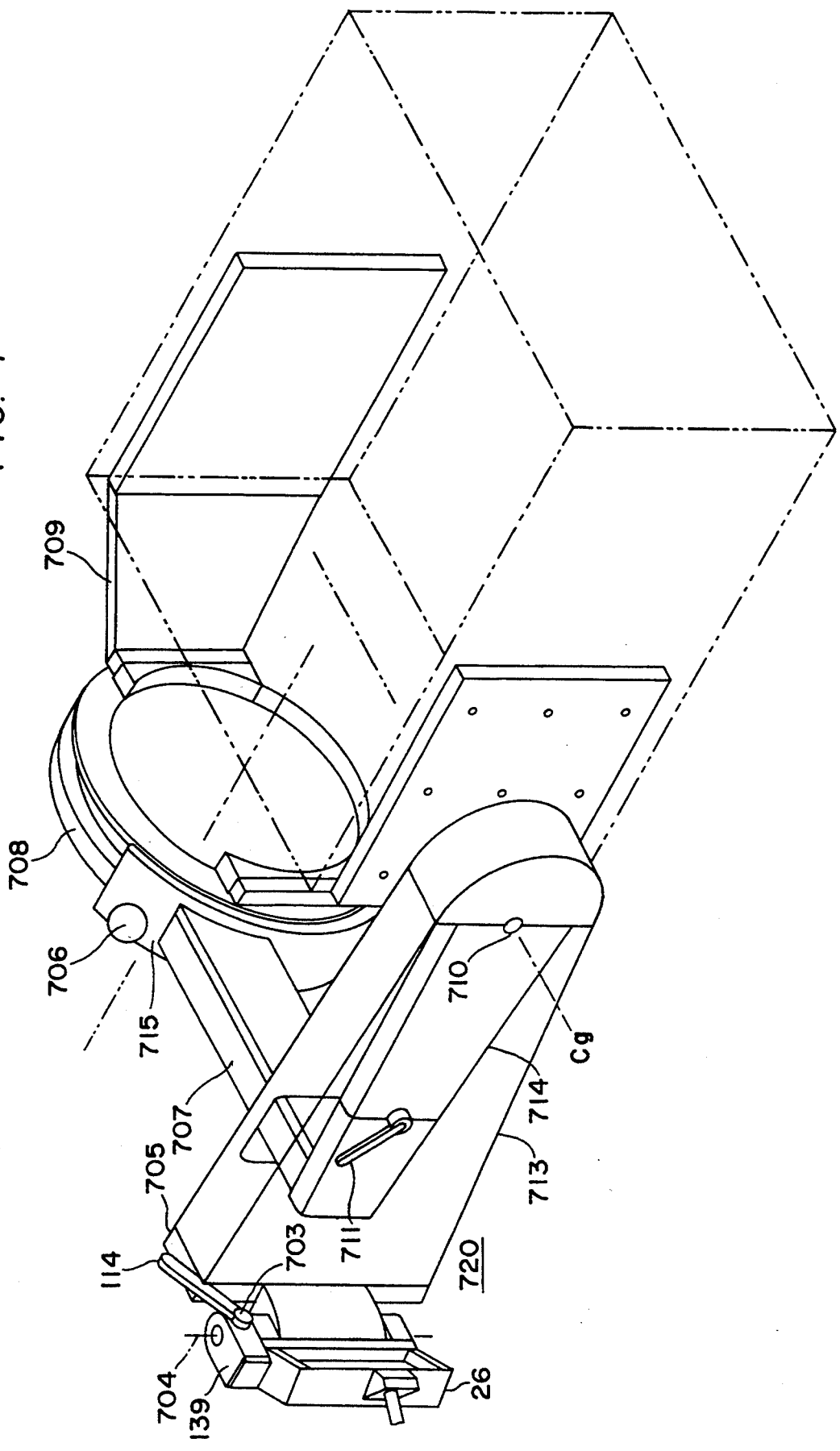
FIG. 7 is a perspective view of the projected cradle assembly in accordance with the present invention.

Referring now to FIGS. 1B and 7, there is shown still a further embodiment of the present invention. This embodiment includes forearm 26 which has a front "C" shaped section which rotatably receives wrist housing 705. Lock collar 139 is secured to the upper surface of forearm 26. Housing 705 rotates with respect to forearm 701 by way of vertical shafts 704a,b which extend through a vertical opening in lock collar 139, through a vertical opening in forearm 26, into wrist housing 705 and then from the bottom of wrist housing 705 into a lower opening in forearm 26. Shafts 704a,b are rigidly secured within wrist housing 705. Wrist housing 705 may be temporarily prevented from rotation by actuating lock screw assembly 114 which is formed within lock collar 139.

Projected cradle assembly 720 includes outer cradle back 713 which is secured to wrist housing 705. Outer cradle back 713 is hollow with inner cradle back 714 located therein. Cradle pivot shaft 710 extends through one side of outer cradle back 713, through inner cradle back 714 and through the other side of outer cradle back 713, thus allowing inner cradle back 714 to pivot about cradle pivot shaft 710. Cradle side 707 is secured to inner cradle back 714 at substantially right angles through an opening in outer cradle back 713. The opening in outer cradle back 713 allows cradle side 707 to move up or down a minor distance as inner cradle back 714 pivots about cradle pivot shaft 710. By actuating lock screw assembly 711, which extends through an opening in outer cradle back 713 to inner cradle back 714, movement of cradle side 707 is prevented.

Moving from wrist housing 705 to cradle pivot shaft 710, the distance between the top and bottom of outer cradle back 713 decreases. Moving from cradle pivot shaft 710 to cradle side 707, the distance between the top and bottom of inner cradle back 714 decreases. In a preferred embodiment of the present invention, inner cradle back 714 pivots about cradle pivot shaft 710 with $+/-$ four degrees of motion.

Cradle side 707 is attached to cable pivot housing 715, on its opposite end, thereby connecting inner cradle back 714 to cable pivot housing 715. Cable pivot housing 715 retains test head adapter ring 708 allowing ring 708 to rotate (in the $\Theta$ X direction) within cable pivot housing 715. The operation of cable pivot housing 715 and test head adapter ring 708 is more fully described in U.S. patent application Ser. No. 07/588,144 filed Jul. 15, 1990 herein incorporated by reference. Test head yoke 709a and b is attached to test head adapter ring 708 and to the test head. In this exemplary embodiment $\Theta$ Z movement is provided by the rotation of the inner cradle back 714 about cradle pivot shaft 710.

The $\Theta$ X movement is provided as previously stated by the rotation of the test head 151 and yoke 709 via test head adapter ring 708 rotation within cable pivot housing 715.

It will now be understood that positioner assembly 100 with this exemplary embodiment simultaneously positions and projects large test heads with 6 degrees of freedom over or under physically large handlers and probers. Thus, the test head may be accurately and effortlessly positioned with respect to the device to be tested as the test head and its cable assembly are rotated at their center of gravity.

Figure 8:
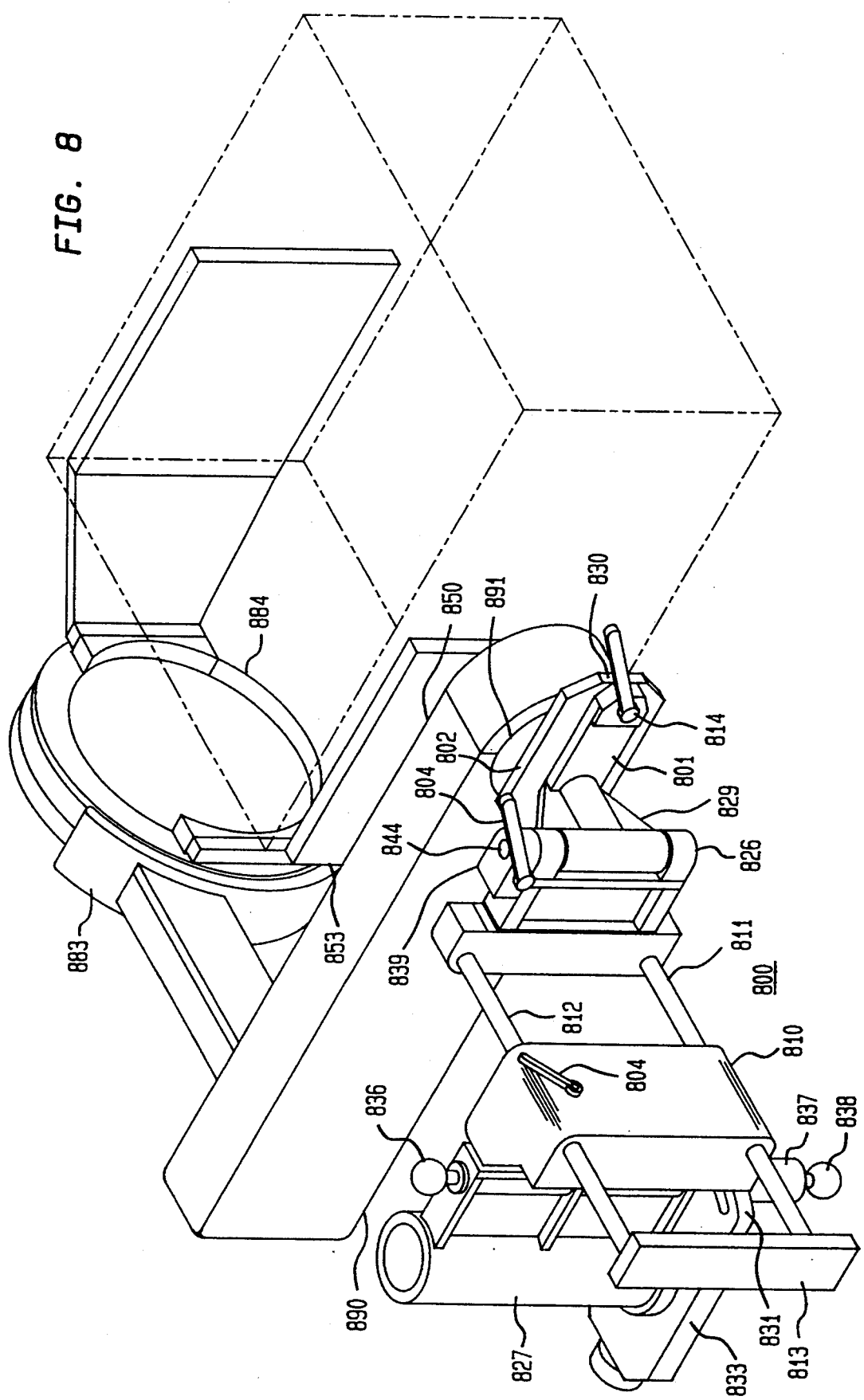
FIG. 8 is another embodiment of the present invention in which a plurality of shafts, oriented horizontally, and an offset cradle assembly is used.

Referring now to FIG. 8, there is shown a further embodiment of the present invention in which forearm 26 and forearm mounts 28a and 28b are replaced with horizontal guide assembly 800. Horizontal guide assembly 800 includes linear guide block 810. Linear guide block 810 is fixedly attached to or integral with upper arm 827.

Linear guide block 810 has linear bearings for receiving horizontal shafts 811 and 812. Bumper 813 is secured to one end of shafts 811, 812 to prevent shafts 811 and 812 from sliding out of the openings in horizontal guide block 810. The other end of horizontal shafts 811, 812 is secured to forearm 826. Horizontal shafts 811,812 may be temporarily prevented from linear motion by actuating lock screw assembly 804 which is formed within linear guide block 810.

Forearm 826, wrist housing 829 and horizontal wrist shaft 830 cooperate as described above with respect to the analogous components of FIG. 5.

Horizontal wrist shaft 830 is attached to cradle back 850.

Cradle back 850 is fixedly attached to cradle side 890 through spacer 891. Test head adapter ring 884 rotates within cable pivot housing 883 as described above with respect to the analogous components of FIG. 7. Yoke 853 is fixedly attached to test head adapter 884 and to the test head as described above with respect to FIG. 7.

Figure 9:
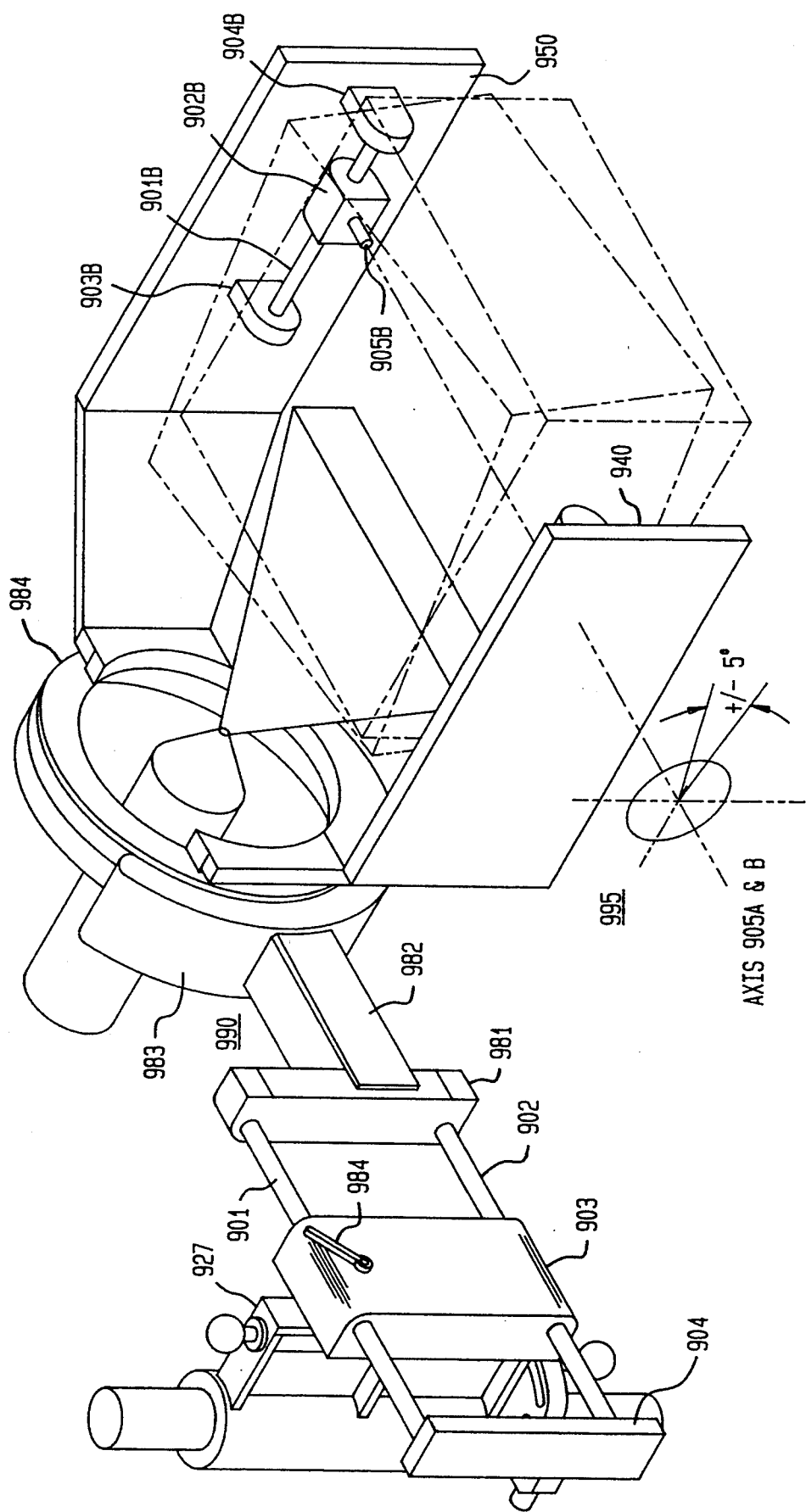
FIG. 9 is another embodiment of the present invention in which a cable pivot housing is used.

Referring now to FIG. 9, there is shown a further embodiment of the present invention in which linear guide block 903 is attached to upper arm 927. Linear guide block 903 has linear bearings for receiving horizontal shafts 901, 902. Bumper 904 is secured to one end of horizontal shafts 901, 902 to prevent horizontal shafts 901, 902 from sliding out of the openings in horizontal guide block 903. Cable pivot adapter 990 is affixed to horizontal shafts 901, 902. Cable pivot adapter 990 includes flange 981 and beam 982. Beam 982 is attached to flange 981 on one end and to cable pivot housing 983 on its opposite end, thereby connecting flange 981 and cable pivot housing 983. Cable pivot housing 983 retains test head adapter ring 984, allowing ring 984 to rotate (in the $\Theta_x$ direction) within housings. 983. The operation of cable pivot housing 983 and test head adapter ring 984 is more fully described in U.S. patent application Ser. No. 07/588,144, filed Jul. 25, 1990 herein incorporated by reference. Test cradle 995 is attached to ring 984. The test head is attached to the cradle through horizontal linear motion guides 940, 950. The details of guides 940, 950 are similar. Thus, the details of guide 940 are not shown.

Horizontal linear motion guides 940, 950 include horizontal shafts 901a, 901b which are secured to cradle assembly 995 by mounting blocks 903a, 904a and 903b, 904b, respectively. Linear guide block 902a slides along horizontal shaft 901a. Similarly, linear guide block 902b slides along horizontal shaft 901b. Linear guide blocks 902a, 902b, each include pivot points 905a, 905b secured thereto, which allows the test head to pivot slightly about an axis perpendicular to the axis defined by horizontal shafts 901a, 901b.

Figure 10:
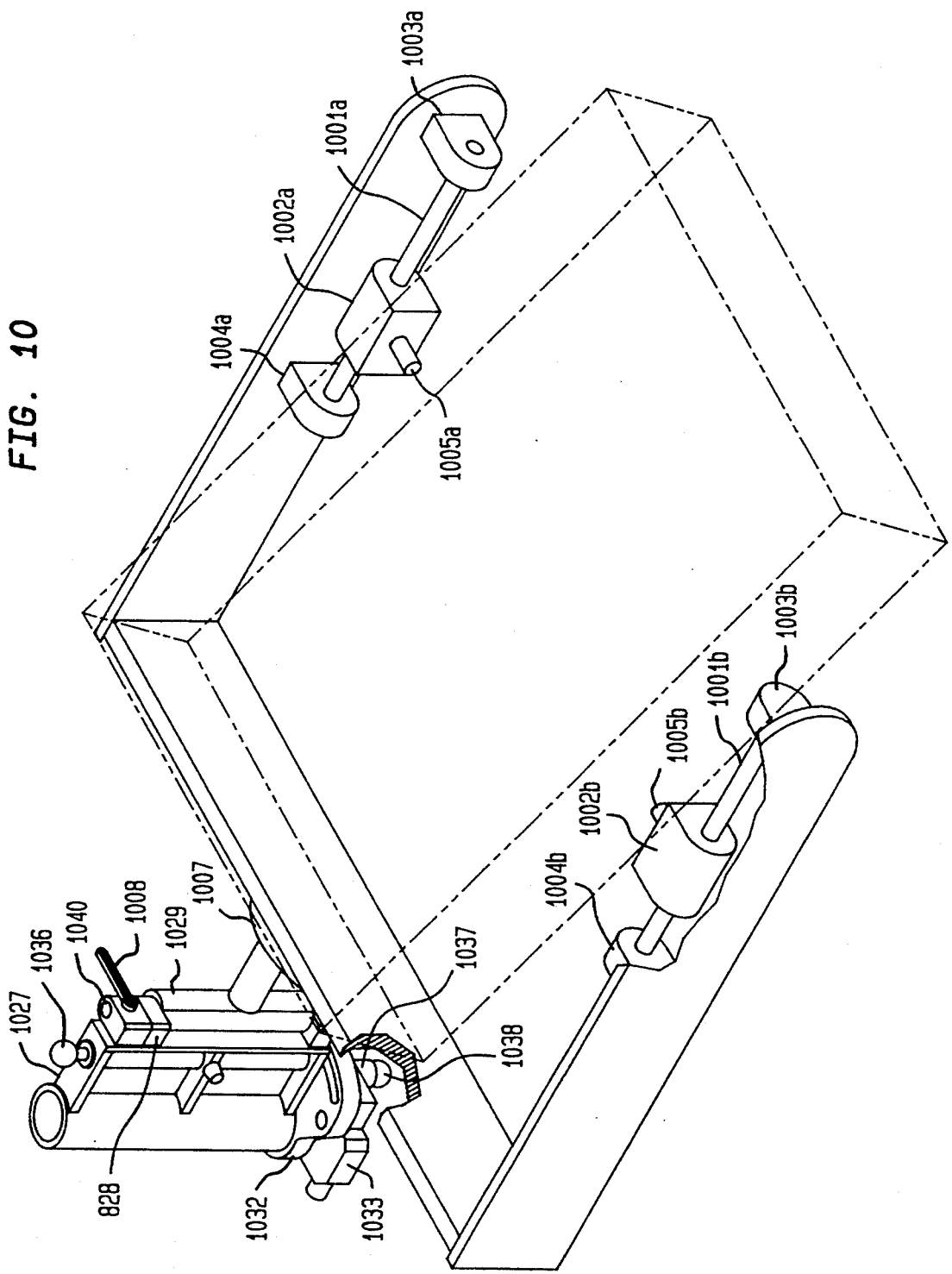
FIG. 10 is another embodiment of the present invention in which horizontal linear motion guides are used.

Referring now to FIG. 10, there is shown a further embodiment of the present invention. In this embodiment, forearm 26 has been deleted. Horizontal wrist housing 1026 is coupled to arm 1027 by way of shafts 1040 a,b inserted through mount blocks 28,29, respectively, with shafts 1040 a,b also inserted through horizontal wrist housing 1029. In place of forearm 26 cradle assembly 1006 is coupled to wrist housing 1029 by horizontal wrist shaft 1030. Horizontal wrist shaft 1030 allows cradle assembly 1006 to be pivoted about the horizontal axis. By tightening horizontal wrist shaft lock screw (not shown), cradle assembly 1006 can be prevented from rotating about the horizontal axis.

Cradle assembly 1006 includes horizontal shafts 1001a, 1001b which are secured to cradle assembly 1006 by mounting blocks 1003a, 1004a and 1003b, 1004b, respectively. Linear guide block 1002a slides along horizontal shaft 1001a. Similarly, linear guide block 1002b slides along horizontal shaft 1001b. Linear guide blocks 1002a, 1002b, each include pivot points 1005a, 1005b secured thereto, which allows the test head to pivot about an axis perpendicular to the axis defined by horizontal shafts 1001a, 1001b. Thus, by allowing movement about two vertical axes and along one horizontal axis (via shafts 1001 *a,b*) motion identical to that obtained by allowing rotation about three vertical axes (FIG. 2) is obtained.

Figure 11B:
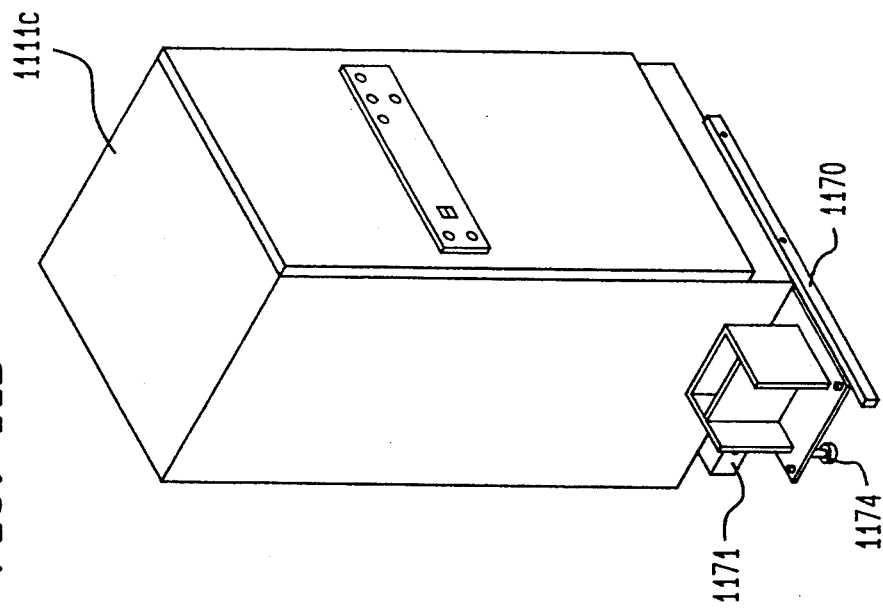
FIGS. 11A-B show further embodiments of the invention with respect to securing the positioner system inside or alongside the test system.
Figure 11A:
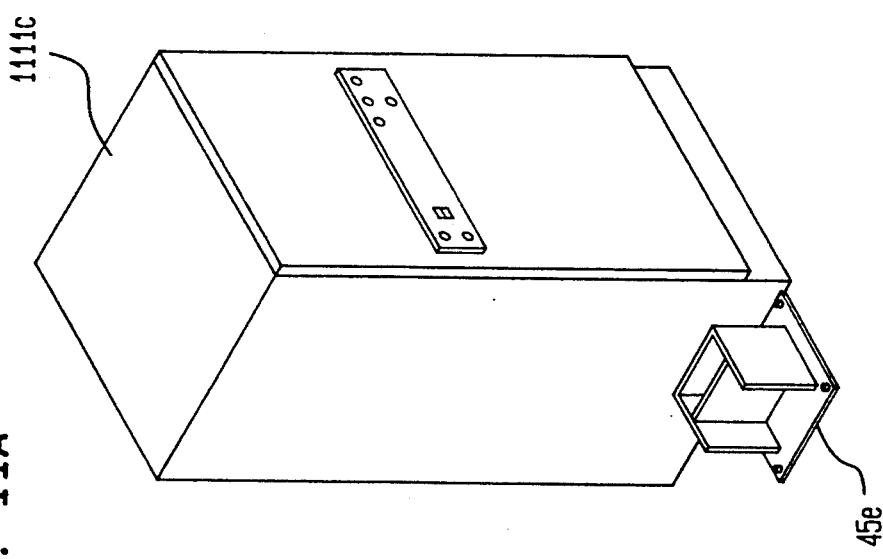

Referring to FIG. 11A, there is shown bottom plate 45e which is directly bolted on to the floor immediately next to test cabinet 1111c of the test system. For purposes of simplicity, the elements within column 45 have not been shown. In still another embodiment as shown in FIG. 11B, bottom plate 45e has connected to its lower surface, perpendicular legs 1170, 1171 connected to adjacent sidewalls of test cabinet 1111c. A leveling pad 1174 may be provided for the leveling of the base. Instead of being bolted to cabinet 1111c, bars 1170, 1171 may be extended (not shown) and coupled to two additional bars holding the remaining two sides of the cabinet. Thus, the four bars may be bolted to each other to rigidly engage cabinet 1111c.

Figure 12:
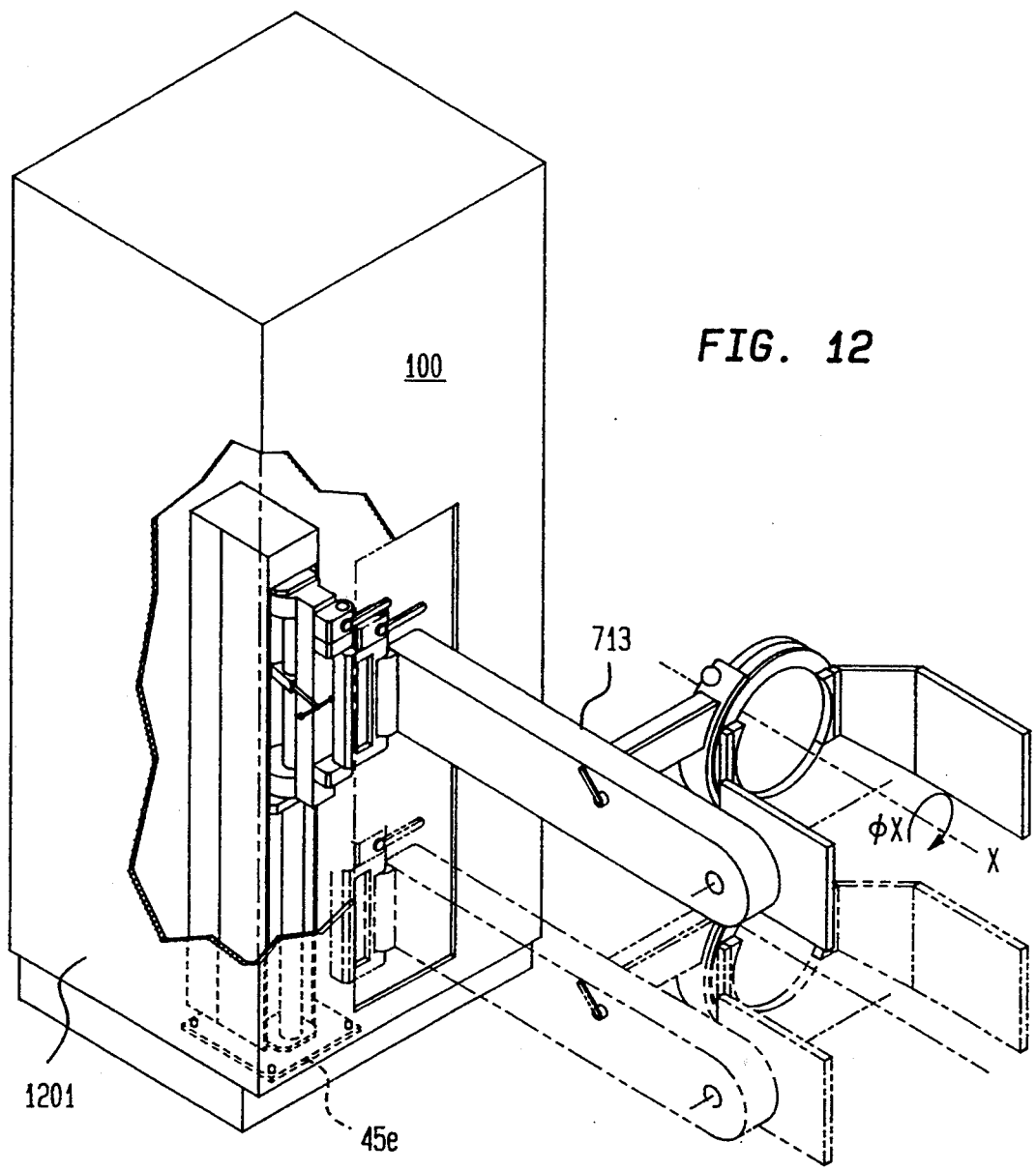
FIG. 12 shows a further embodiment of the invention with respect to securing the positioner system in a test system cabinet.

In still another embodiment of the present invention as shown in FIG. 12, the base 45e has been attached inside the test system cabinet 1201. By controlling the plurality of locks (e.g. 14,36,104,114,124) by remote control in conjunction with the embodiment of FIG. 7, the test head can be projected by a long outer cradle back 713 to any desired distance. In this manner the complete column mechanism can be enclosed in the test system cabinet and all salient functions of the positioner system can be retained.

While the invention has been described in terms of an exemplary embodiment, it is contemplated that it may be practiced as outlined above with modifications within the spirit and scope of the appended claims.

What is claimed:

1. A system for positioning an electronic test head for docking and undocking said electronic test head with an electronic device handler and for providing rotation of said electronic test head about a center of gravity, said system comprising:
   a support column having a top;
   a projected cradle assembly coupled to said support column, said projected cradle assembly comprising:
   an outer cradle back having a first end and a second end, said outer cradle back having a hollow region and an opening;
   an inner cradle back having a first end and a second end, said inner cradle back extending through said opening and said hollow region of said outer cradle back and coupled to said outer cradle back;
   said inner cradle back pivotable about an axis located near the second end of said outer cradle back and the second end of said inner cradle back; and
   means for coupling said test head to said inner cradle back so that
   a) said test head is projected horizontally away from a vertical axis defined by said support column for pivotable movement of said test head about said center of gravity and
   b) at least a portion of said test head is below said top of said support column.

2. The system of claim 1, wherein said outer cradle back is tapered from said first end to said second end.

3. The system of claim 1, wherein said inner cradle back is tapered from said second end to said first end.

4. The system of claim 1, wherein said projected cradle assembly further comprises means for fixing the position of said inner cradle back about said axis.

5. The system of claim 1, wherein said means for coupling said test head to said inner cradle back includes a cradle side interposed between said inner cradle back and said means for coupling said test head to said inner cradle back.

6. The system of claim 5, wherein said cradle side is coupled to said inner cradle back near said first end of said inner cradle back.

7. The system of claim 5, wherein said cradle side is coupled to said inner cradle back at a substantially right angle.

8. The system of claim 1, wherein said axis is defined by a shaft.

9. The system of claim 1, wherein said means for coupling said test head to said inner cradle back includes means for supporting said test head for docking and undocking said electronic test head with said electronic device handler.

10. The system of claim 1, wherein said support column is housed within an enclosure.

11. The system of claim 1, wherein said support column has a main shaft, said system further comprising:
    a tube disposed about the main shaft and movable along the main shaft;
    tube locking means for releasably preventing movement of the tube along the shaft;
    an upper arm assembly having a member for pivoting about the tube;
    stationary support means secured to the tube and having a surface for supporting the upper arm assembly and over which the upper arm assembly slides as it pivots about the tube; and
    the upper arm assembly having upper arm locking means for releasably locking the upper arm assembly to the support means to prevent pivoting of the upper arm unit about the tube.

12. The system of claim 1, wherein said support column has a main shaft, said system further comprising:
    a tube disposed about the main shaft and movable along the main shaft;
    tube locking means for preventing movement of the tube along the main shaft;
    an upper arm assembly having a cylindrical member for pivoting about the tube;
    shoulder means pivotable about the tube and for slidably engaging and supporting the upper arm assembly as the upper arm assembly pivots about the tube;
    upper arm locking means for releasably locking the upper arm assembly to the shoulder means to prevent pivoting of the upper arm assembly relative to the shoulder means;
    lower support means secured to the tube and precluded from rotation for slidably engaging and supporting the shoulder means as it pivots about the tube; and
    shoulder locking means for releasably locking the shoulder means to the lower support means to prevent pivoting of the shoulder means relative to the lower support means.

13. A system for positioning an electronic test head for docking and undocking said electronic test head with an electronic device handler and for providing rotation of said electronic test head about a center of gravity, said system comprising:
    a support column;
    a projected cradle assembly coupled to said support column, said projected cradle assembly comprising:

an outer cradle back having a top surface, a bottom surface, a first end and a second end, said outer cradle back having a hollow region and an opening;

an inner cradle back having a first end and a second end, said inner cradle back extending through said opening and said hollow region of said outer cradle back and coupled to said outer cradle back;

said first end of said inner cradle back movable upward and downward between said top surface and said bottom surface of said outer cradle back and pivotable about an axis located near the second end of said outer cradle back and the second end of said inner cradle back; and means for coupling said test head to said inner cradle back for pivotable movement of said test head about said center of gravity and for supporting said test head for docking and undocking said electronic test head with said electronic device handler.

14. A system for positioning an electronic test head according to claim 13, wherein said inner cradle back has a linear elongated shape.

15. A system for positioning an electronic test head according to claim 13, wherein said outer cradle back has an elongated shape extending longitudinally lengthwise along a first axis, said inner cradle back has a further elongated shape extending longitudinally lengthwise along a second axis, and said inner cradle back is pivotable so that said first axis becomes parallel to said second axis.

* * * * *